United States Patent [19]

Harrison et al.

[11] Patent Number: 5,636,368

[45] Date of Patent: Jun. 3, 1997

[54] METHOD FOR PROGRAMMING COMPLEX PLD HAVING MORE THAN ONE FUNCTION BLOCK TYPE

[75] Inventors: David A. Harrison, Cupertino; Joshua M. Silver, Sunnyvale; Soren T. Soe, San Jose, all of Calif.

[73] Assignee: Xilinx, Inc., San Jose, Calif.

[21] Appl. No.: 370,768

[22] Filed: Dec. 23, 1994

[51] Int. Cl.$^6$ .................................................. G06F 3/00
[52] U.S. Cl. ........................ 395/500; 395/800; 395/412; 364/488; 326/41; 326/38; 326/39; 326/40; 340/825.83; 340/825.79
[58] Field of Search ......................... 364/488, 489, 364/490, 491, 716, 718, 735, 258, 578; 395/800, 200, 425, 400, 412, 100, 500; 326/38–40, 47, 37, 86, 50–96, 41, 97, 114, 119; 327/137, 408, 515; 340/825.83, 825.79

[56] References Cited

U.S. PATENT DOCUMENTS

| | | | |
|---|---|---|---|
| 4,791,602 | 12/1988 | Resnick | 326/38 |
| 4,876,466 | 10/1989 | Kondou et al. | 364/716 |
| 5,015,884 | 5/1991 | Agrawal et al. | 364/716 |
| 5,034,899 | 7/1991 | Schult | 364/488 |
| 5,089,973 | 2/1992 | Furtek | 364/489 |
| 5,128,871 | 7/1992 | Schmitz | 364/489 |
| 5,165,086 | 11/1992 | Kamejima et al. | 364/488 |
| 5,202,592 | 4/1993 | Yoneda et al. | 364/716 |
| 5,283,875 | 2/1994 | Gibson et al. | 364/DIG. 1 |
| 5,349,250 | 9/1994 | New | 364/784 |
| 5,349,691 | 9/1994 | Harrison et al. | 364/718 |
| 5,357,152 | 10/1994 | Jennings, III et al. | 307/465 |
| 5,362,999 | 11/1994 | Chiang | 326/44 |
| 5,408,628 | 4/1995 | Ameti | 364/DIG. 1 |
| 5,440,247 | 8/1995 | Kaplinsky | 326/39 |
| 5,448,493 | 9/1995 | Topolewski et al. | 364/489 |
| 5,450,021 | 9/1995 | Chiang | 326/39 |
| 5,457,409 | 10/1995 | Agrawal et al. | 326/39 |
| 5,489,857 | 2/1996 | Agrawal et al. | 326/41 |
| 5,499,192 | 3/1996 | Knapp et al. | 364/489 |

OTHER PUBLICATIONS

Z. Hasan, D. Harrison, and M. Ciesielski, "A Fast Partitioning Method for PLA-Based FPGA's" IEEE Design & Test of Computers, Dec. 1992, pp. 34–39.

Primary Examiner—Kevin J. Teska
Assistant Examiner—Jacques Louis-Jacques
Attorney, Agent, or Firm—Patrick T. Bever; Jeanette S. Harms

[57] ABSTRACT

A method for programming programmable logic devices (PLDs) having multiple function block types to implement a logic function, whereby the logic function is mapped into one of the function block types before being mapped into the remaining function block types. In one embodiment, a PLD containing both "fast" function blocks (FFBs) and "high density" function blocks (HDFBs) are programmed such that the FFBs are programmed prior to the HDFBs. This method maximizes the overall speed of an implemented logic function.

22 Claims, 15 Drawing Sheets

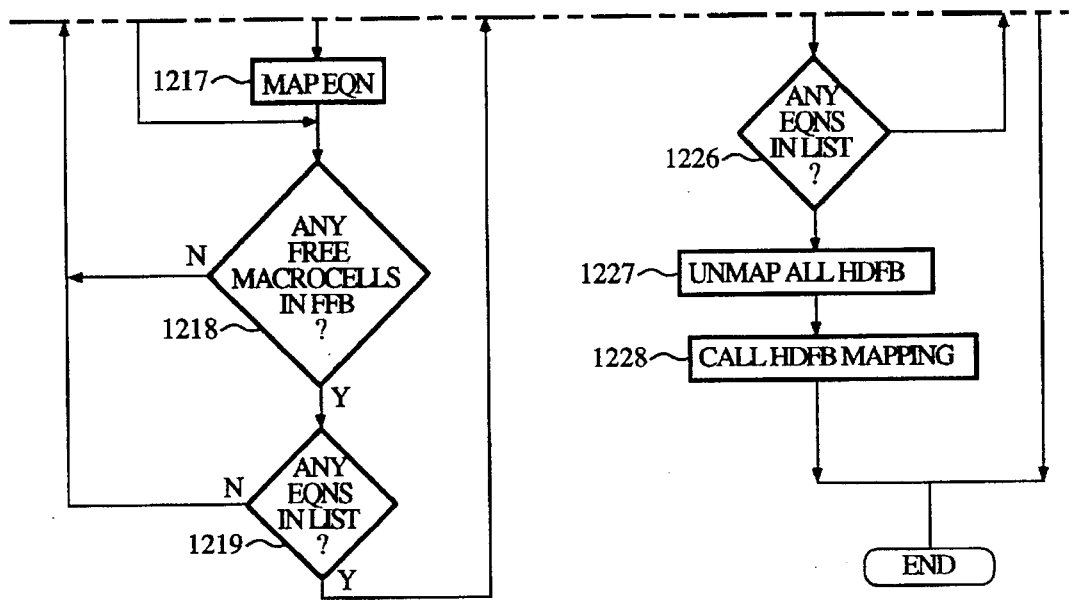
FIG. 12B
KEY TO FIGURE 12
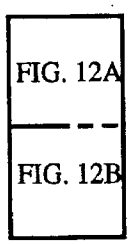

METHOD FOR PROGRAMMING COMPLEX PLD HAVING MORE THAN ONE FUNCTION BLOCK TYPE

BACKGROUND OF THE INVENTION

1. Field of the Invention

The present invention relates to programmable logic devices, and more specifically to a method for programming complex programmable logic devices having multiple function block types.

2. Background Art

Programmable logic devices (PLDs) are a class of integrated circuits (ICs) which can be programmed by a user to emulate various logic functions. Logic designers typically use PLDs to implement control logic in electronic systems because they are relatively easy to program, and often can be reprogrammed to change the emulated logic function. This makes their use in an electronic system's design phase less costly than custom hardwired or "application specific" integrated circuits (ASICs).

One major class of PLDs includes a set of input pins, a programmable AND plane connected to the input pins, an OR plane connected to output lines of the AND plane and a set of output pins connected to output lines of the OR plane. The AND plane provides a matrix of programmable connections where each column connects to an input pin and each row forms an output line of the AND plane, called a product term line, which connects to the OR plane. The OR plane may be programmable, such that each product term line is connectable to columns leading to different output pins, in which case the PLD is called a programmable logic array (PLA). Alternatively, the OR plane may be fixed, such that each product term line is assigned to a particular output pin, in which case the PLD is called a programmable array logic (PAL) device.

Because PLAs and PALs contain two levels of logic (AND and OR), these arrays are capable of implementing logic functions that are representable in a "sum of products" form. A sum of products form of a logic function is essentially a set of product terms (p-terms) for each output of the function. Such a logic function is represented in a PLD by programmed connections in the AND plane and OR plane. Each p-term line has a programmable input connection in the AND plane to each input pin and produces a single output value representing the logical AND or "product" of the connected inputs. Usually, both the original input pin value and its complement are available for connection to a p-term line. Each output has a programmable p-term connection in the OR plane and produces an output value representing the logical OR or "sum" of the connected p-terms.

These early PLDs were well-received by logic designers. However, as logic functions grew increasingly larger and more complex, logic designers were required to wire together two or more small PLDs to provide sufficient logic capacity. Although this process was tolerated during development and testing, it increased the cost and size of production units. This generated a demand for PLDs with increasingly larger logic capacity.

To meet the ever-increasing demand for greater capacity, PLDs with increasingly complex architectures have been developed. One popular complex PLD type, known as erasable programmable logic devices (EPLDs), includes a plurality of "function blocks," input/output (I/O) resources, and an interconnect matrix such that each of the function blocks is interconnectable to any other function block or I/O resource of an EPLD through the interconnect matrix. Each function block of an EPLD is structured like the two-level PLDs, described above. In effect, EPLDs incorporate several early PLDs and associated connection circuitry onto a single integrated circuit. This provides a circuit designer the convenience of implementing into a single device a complex logic function intended to program a wired collection of smaller PLDs using a single IC.

The function blocks of early EPLDs were essentially identical in size (capacity) and signal delay. Therefore, programming methods developed for these early EPLDs were primarily focused on implementing the desired logic functions into as few function blocks as possible, thereby leaving available as many resources of the EPLD as possible. One such prior art programing method is described in "A Fast Partitioning Method for PLA-Based FPGAs", *IEEE Design & Test Of Computers*, 1992, by Z. Hasan, D. Harrison, and M. Ciesielski.

More recently, a "Dual Block" EPLD was developed which includes two types of function blocks—a "fast" function block (FFB) whose architecture, in effect, sacrifices programmability for speed, and a "high density" function block (HDFB) whose architecture is designed for maximum programmability. This type of EPLD allows portions of a logic function requiring fast input-pin-to-output-pin times to be implemented by the FFBs, and the remaining portions of the logic function to be implemented by the HDFBs.

The above-mentioned prior art programing methods are inadequate for programing "Dual Block" EPLDs because these methods fail to consider the benefits of maximizing the use of one type of function block over the other.

SUMMARY OF THE INVENTION

The present invention involves programing complex PLDs having multiple function block types to implement logic functions, whereby the logic function are mapped into one of the function block types before being mapped into the remaining function block types. This allows desirable features of one function block type to be utilized by the logic function before other function block types.

In the specific example described below, an EPLD contains both "fast" function blocks (FFBs), which have limited programmability but exhibit high-speed signal propagation, and "high density" function blocks (HDFBs), which have a high degree of programmability but exhibit relatively slow signal propagation.

A programming method in accordance with the present invention initially converts the logic equations of a user's logic function into a form which has the greatest possibility of being mapped into either the FFBs or the HDFBs. Then, the equations are designated by the user as being "fast" (i.e., designated for implementation in an FFB). These designated equations are then divided (split) into subequations (if necessary) which can be mapped easily into the FFBs. The remaining (undesignated) equations are tested to determine if they can be implemented in the FFBs and, if so, they are split (if necessary) into subequations which can be easily mapped into the FFBs. However, if the undesignated equations cannot fit within the FFBs, they are split (if necessary) into subequations which can be easily mapped into the HDFBs.

The programming method then determines whether any of the equations of the logic function are implementable in the interconnect matrix linking the FFBs and HDFBs. A full cross-point interconnect matrix acts as an AND gate. The programming method searches for equations which are implementable in as interconnect matrix AND functions, and tests whether the implementation of the equation in the interconnect matrix is possible and desirable. More particularly, the program tests whether the signals from the different function block types are of consistent polarities (positive or negative) to allow implementation in the interconnect matrix. Further, if implementation of the equation in the interconnect matrix causes a predetermined number of equations to be unimplementable in an FFB, then interconnect matrix implementation is not used.

The programming method then maps the converted and split equations of the logic function into the FFBs and HDFBs. In accordance with the present invention, the mapping process initially maps only the desired function block type (e.g. FFBs) until the desired function block type is fully utilized. In one embodiment, the program attempts to map every FFB-qualified equation into each of the FFBs to assure that each FFB is fully utilized. Only after all of the FFBs have been maximally utilized or until all FFB-qualified equations have been mapped does the program proceed to map the HDFBs. This process can be extended to secondary function block types in applications where there are three or more function block types-that is, following the mapping of a most-desirable function block type, the program proceeds with mapping a second most-desirable function block type.

After mapping, the programming method performs a refinement subroutine with rearranges the mapping placement of the equations to produce an efficient arrangement of the logic function. The program recognizes that constraints are placed on the rearranging process based on the designation of FFB equations and the desirability of fully implementing the FFBs.

Finally, after the logic function is fully mapped, a bit map is formed which is downloaded by the computer to a device programmer, which applies the bit map to the individual programmable elements of a target EPLD, thereby programming the EPLD to implement the logic function.

BRIEF DESCRIPTION OF THE DRAWINGS

These and other features, aspects and advantages of the present invention will become better understood with regard to the following description, appended claims, and accompanying drawings, where:

FIG. 12(A) and 12(B) are flowchart showing a Refinement procedure of the EPLD programming method.

DETAILED DESCRIPTION

The present programming method is directed to erasable programmable logic devices (EPLDs) incorporating two or more function block types. A "function block type" is generally defined as a family of substantially identical function blocks including a particular arrangement of logic circuitry and programmable connections. For example, function block types may vary by size (e.g., the number of input signals or generated product terms), by speed or level of programmability (e.g., the number and location of programmable elements used to configure signal paths within the function block), and by specialized circuitry (e.g., one function block type may include an arithmetic logic unit not found in other function block types of the EPLD).

The present programming method is described with particular reference to the XC7300 EPLD family manufactured by Xilinx, Inc. of San Jose, Calif. A brief description of the XC7300 EPLD family is provided below. Additional description of the XC7300 EPLD family is provided in *Programmable Logic Data Book*, 1994, published by Xilinx, Inc., which incorporated herein by reference in its entirety. However, note that the present invention is not limited to the specific function block types found in the devices of the XC7300 EPLD family.

Dual Block EPLD

Figure 1:
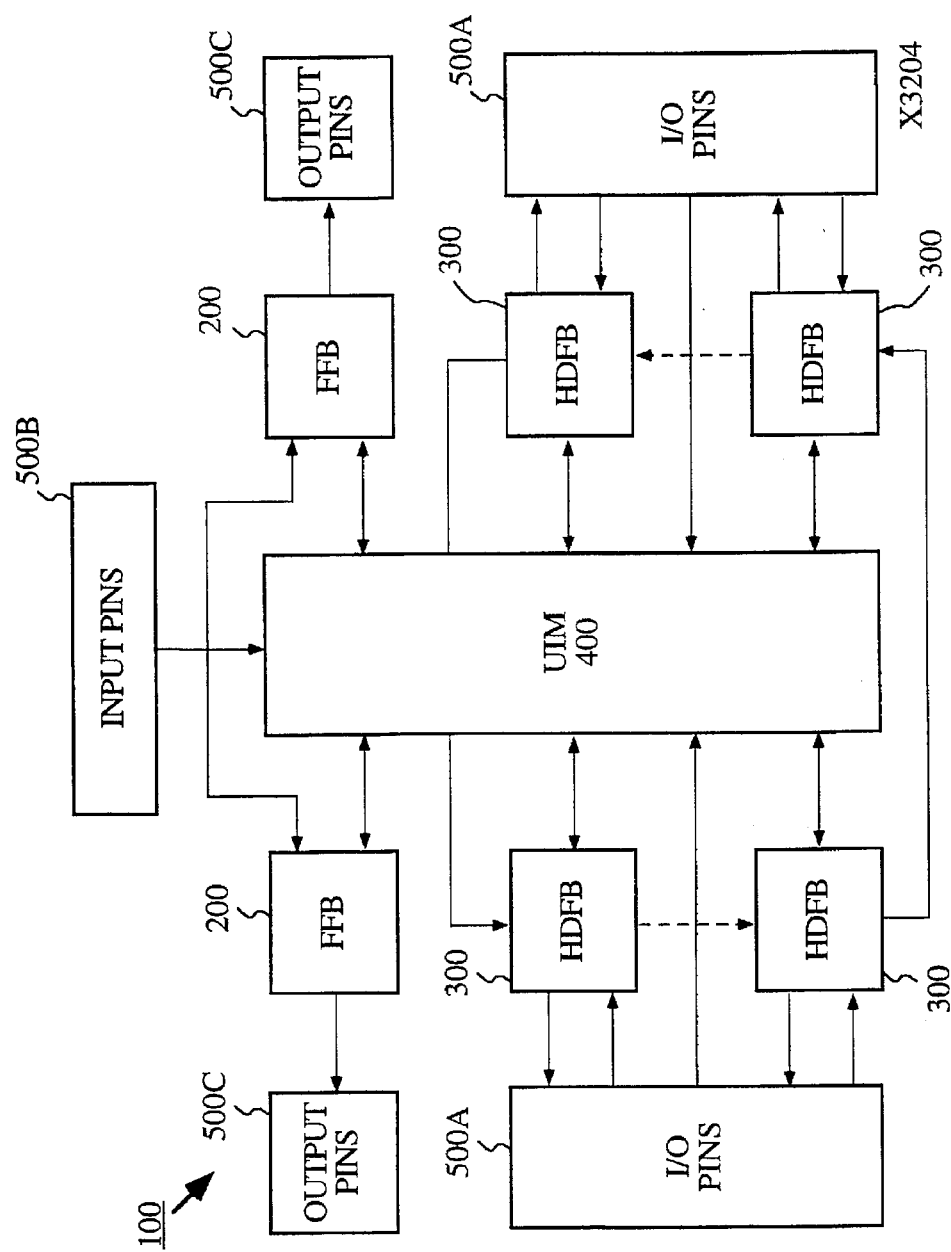
FIG. 1 is a circuit diagram showing a EPLD including multiple function block types.

FIG. 1 shows a simplified block diagram of an EPLD 100 which includes features common to the XC7300 EPLD family. The XC7300 EPLD family employs a Dual-Block architecture including Fast Function Blocks (FFBs) 200 and High-Density Function Blocks (HDFBs) 300. A Universal Interconnect Matrix (UIM) 400 provides programmable interconnections between the FFBs 200 and the HDFBs 300. Input signals of EPLD 100 are entered into HDFBs 300 and UIM 400 through Input/Output (I/O) pins 500A. Inputs signals are also entered into the FFBs 200 and UIM 400 through dedicated "fast" input pins 500B. Output signals are routed to I/O pins 500A from HDFBs 300, and to dedicated "fast" output pins 500C from FFBs 200.

Fast Function Blocks (FFBs)

Figure 2A:
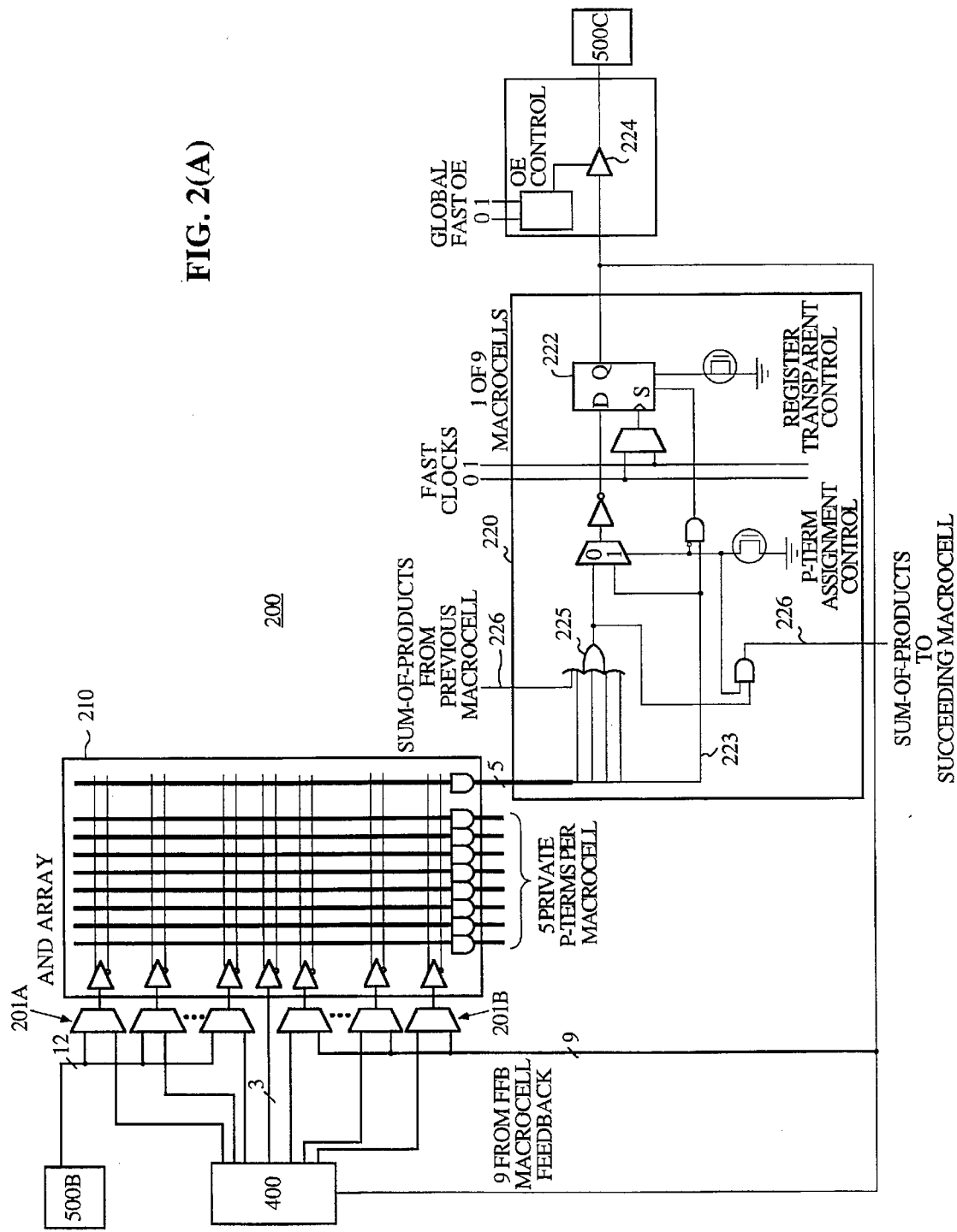
FIG. 2(A) is a simplified schematic diagram of a Fast Function Block (FFB) of the XC7300 EPLD family.

FIG. 2(A) shows a simplified schematic of an FFB 200. Each FFB 200 includes an AND array 210 and nine macrocells (one macrocell 220 shown). The AND array 210 receives 24 signals and their complements (for simplicity, only seven input lines are shown). Multiplexers 201A are programmed to select one of the 12 input signals from UIM 400 or one of the signals from fast input pins 500B. Multiplexers 201B are programmed to select one of nine feedback signals from macrocell 200 and input signals from UIM 400. Signals from three lines from UIM 400 are provided directly to AND array 210. The AND array 210 in each FFB 200 generates 45 product terms which drive the nine macrocells 200, with five product terms from the AND array 210 being allocated to each macrocell 220. Four of these product terms are ORed together by an OR gate 225 and drive the input of a programmable D-type flip-flop 222.

The fifth product term 223 drives the asynchronous Active-High Set Input to flip-flop 222. The clock signal provided to flip-flop 222 is one of two global FastCLK signals (FCLK0 or FCLK1) that are distributed with short delay and minimal skew over the entire chip.

Macrocell 220 applies output signals to a fast output pin 500C through a 3-state output buffer 224. Each output buffer 224 is controlled by one of two dedicated Fast Output Enable inputs, enabled permanently or disabled permanently. The macrocell output is also routed back as an input to the UIM 400 and as a selectable input to AND array 210.

Figure 2B:
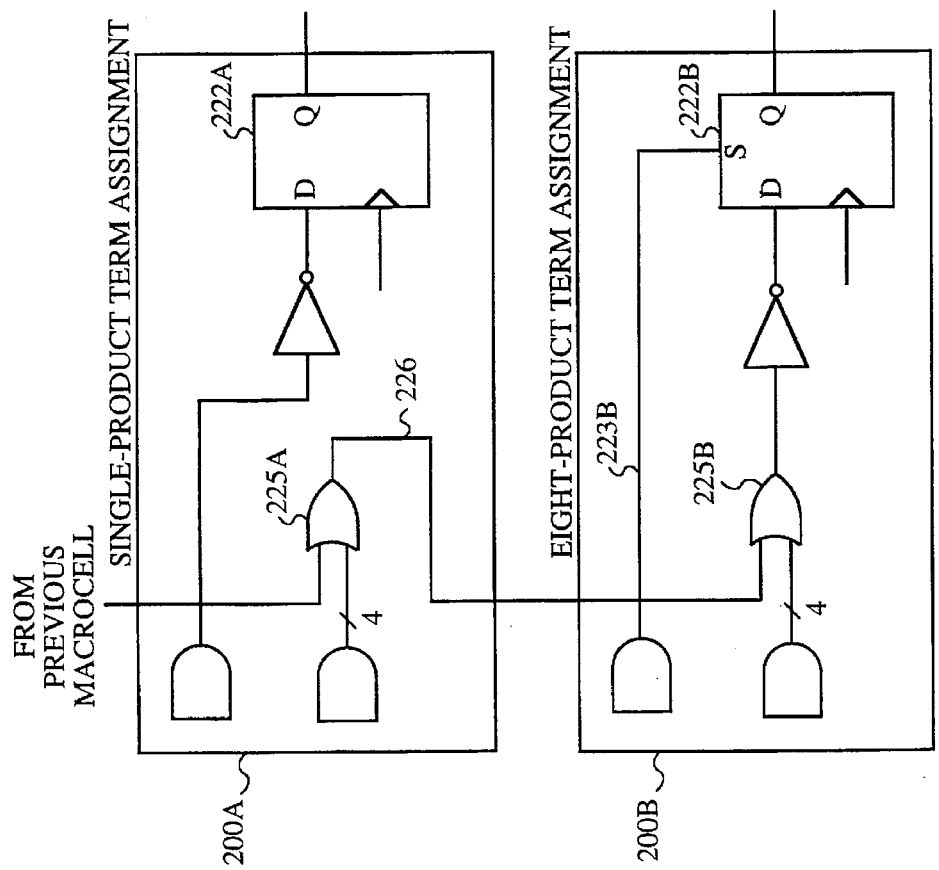
FIG. 2(B) is a simplified schematic diagram illustrating a product term assignment associated with the Fast Function Block of FIG. 2(A)

FIG. 2(B) shows a simplified wiring diagram of an "export chain" (product term assignment) scheme that provides product-term flexibility without disabling macrocell outputs. Product term assignment transfers sum-of-product terms from the output of an OR gate 225 of macrocell 220A to the input terminal of an OR gate 225 of macrocell 220B. This configuration allows complex logic functions having up to 36 product terms to be implemented in one FFB 200. When product terms are assigned to adjacent macrocells 220, the fifth private Pterm 223 may be applied to the D-input to the macrocell register 222B (See discussion regarding merging during FFB mapping, below). Thus, macrocell register 222B is still usable even though the OR gate 225B is in use.

High-Density Function Blocks (HDFBs)

Figure 3:
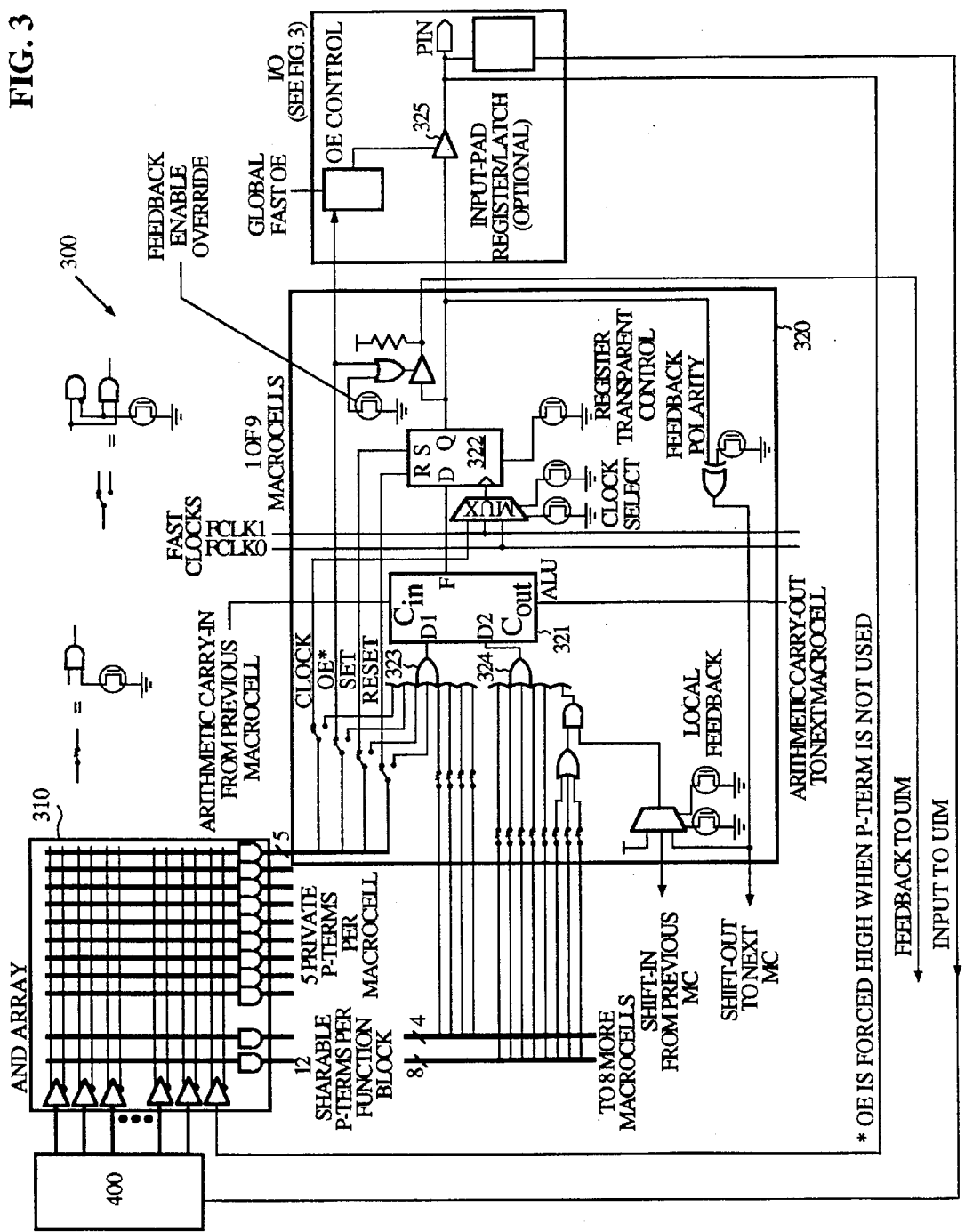
FIG. 3 is a simplified schematic diagram showing a High-Density Function Block (HDFB) of the XC7300 EPLD family.

FIG. 3 shows a schematic diagram of an HDFB 300. Each HDFB 300 includes an AND array 310 and nine macrocells (one macrocell 320 shown). The AND array 310 of HDFB 300 receives 21 signals and their complements from UIM 400. The AND array 310 provides 5 private product terms per macrocell 320, and also provides 12 sharable product terms, which are uncommitted product terms available for use by any of the nine macrocells within HDFB 300.

Each macrocell 320 includes an Arithmetic Logic Unit (ALU) 321, a flip-flop 322, OR gates 323 and 324, and a tri-state output buffer 325. The five private product terms received by macrocell 320 are used as the primary input signals for combinatorial functions implemented in ALU 321, or as individual Reset, Set, Output-Enable, and Clock logic functions for flip-flop 322. OR gate 323 receives up to four private product terms and up to four shared product terms, whereas OR gate 324 receives the fifth private product term and up to eight of the remaining shared product terms. The output terminal of OR gate 323 is connected to the D1 input of ALU 321. The D2 input terminal is driven by the output signal of OR gate 324.

ALU 321 has two programmable modes: logic and arithmetic. In a logic mode, ALU 321 functions as a 2-input function generator using a 4-bit look-up table that programmably generates any Boolean function of its D1 and D2 input signals of each macrocell 320. In an arithmetic mode, ALU 321 programmably generates the arithmetic sum or difference of the D1 and D2 input signals. Combined with the carry input signal from an adjacent macrocell 300, ALU 320 operates as a 1-bit full adder and generates a carry output to an adjacent macrocell 300.

The output signal of ALU 321 drives the D-input terminal of flip-flop 322. Flip-flop 322 is triggered by the clock input, thereby making the Q output signal identical to the D input signal. The clock signal of flip flop 322 is either one of the private product terms or one of two global Fast-CLK signals (FCLK0 and FCLK1). Global FastCLK signals are distributed to every flip-flop 322 with short delay and minimal skew.

In addition to driving output buffer 325, the output signal of macrocell 320 is routed back as an input signal to UIM 400. In this embodiment, either a private product term from macrocell 320 or a global fast OE signal triggers the Output Enable signal (OE Control) to be provided to output buffer 325, thereby providing a feedback signal to UIM 400.

Universal Interconnect Matrix (UIM)

As mentioned previously, UIM 400 receives input signals from macrocell feedback lines, I/O pins 500A, and dedicated input pins 500B (FIG. 1). Acting as an unrestricted crossbar switch, UIM 400 provides 21 output signals for each HDFB 300 and 24 output signals to each FFB 200. In accordance with one embodiment of the present invention, any UIM input line is programmably connectable to any UIM output line. Further, when multiple input lines are programmed to be connected to the same output line, this output line produces the logical AND of the signals on the input lines. By choosing the appropriate signal inversions at the input pins, a macrocell outputs an AND-array input signal, wherein that AND logic can also be used to implement wide NAND, OR or NOR functions.

Input/Output (I/O) Blocks

Figure 4:
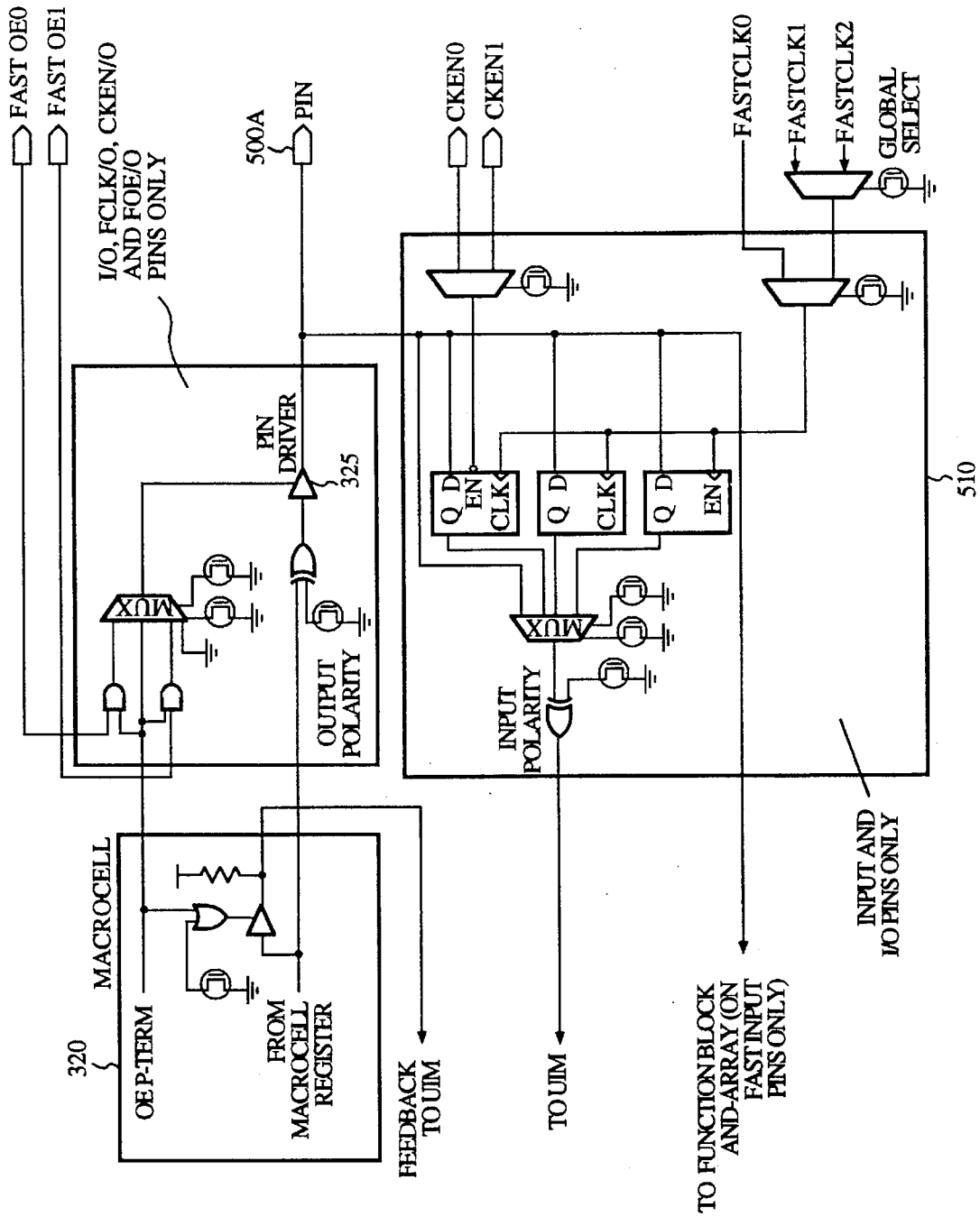
FIG. 4 is a simplified schematic diagram showing an input/output structure of the XC7300 EPLD family.

FIG. 4 is a simplified schematic diagram showing an I/O block 510 associated with I/O pins 500A and input pins 500S. Output lines from macrocells 320 are connected directly through a 3-state output buffer 325 to output pins 500A, each buffer 325 being controlled by an Output Enable product term. Specifically, two dedicated Fast OE input signals, i.e. Fast OE0 and Fast OE1, in conjunction with, the individual Output Enable product term, OE P-Term, control output buffer 325. Each input signal applied to I/O pin 500A is connected to I/O block 510 which can be configured as direct, latched, or registered.

Programming Method

An EPLD programming method according to the present invention will now be discussed.

System Context of the Invention

Figure 5:
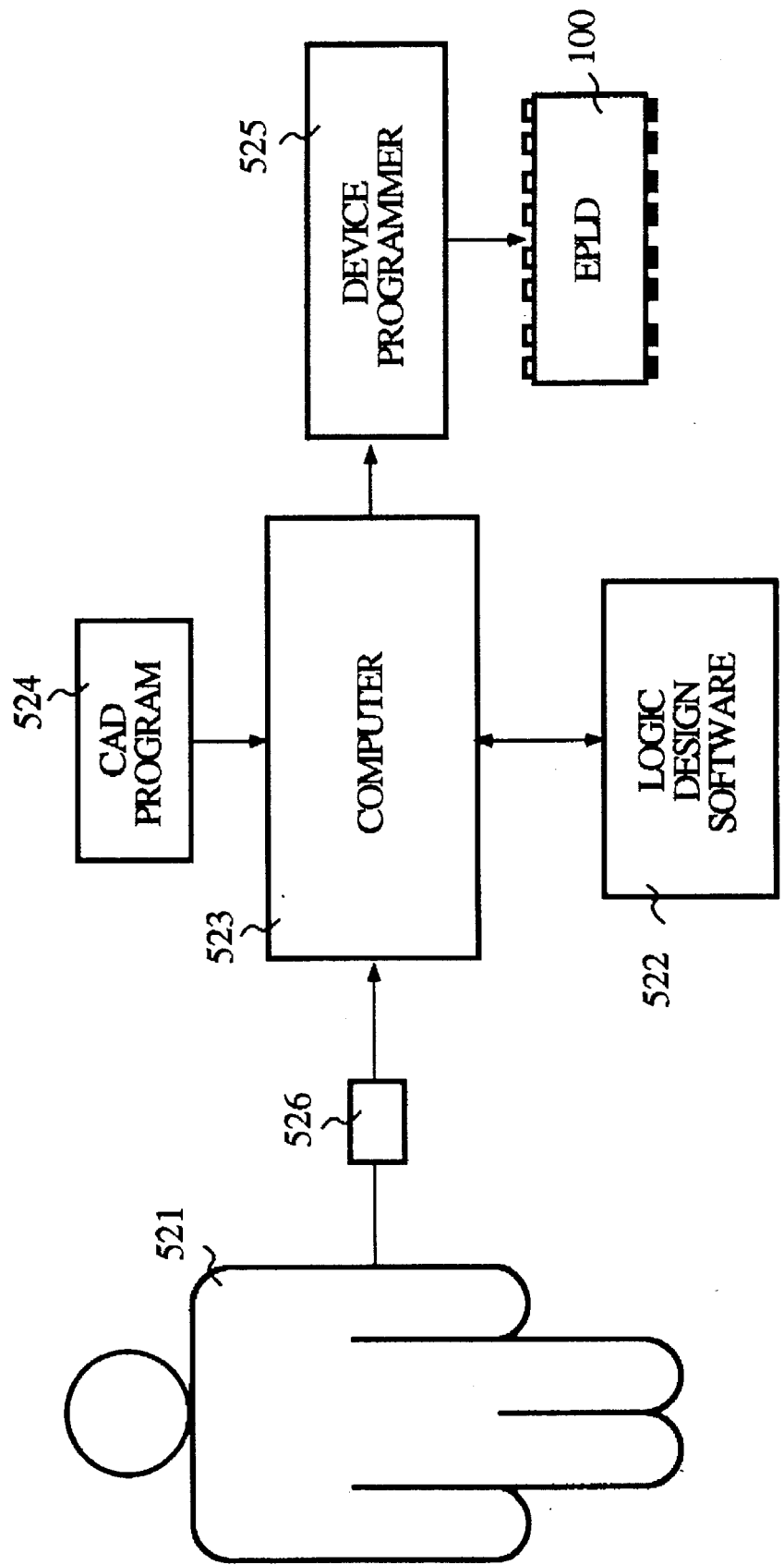
FIG. 5 is a diagram showing a typical "machine" for programming an EPLD in accordance with the present invention.

FIG. 5 shows a "machine" for programming an EPLD 100 in accordance with the present invention. A human user 521 provides the EPLD 100 to be programmed and specifies the logic function (circuit design) 526 which EPLD 100 is to implement. CAD program 524 and logic design software 522, operating in a computer 523, take logic function 526 and determine how to "map" the logic efficiently onto EPLD 100. Specifically, if the specified logic function is represented in a schematic or high-level language format, logic design software 522 transforms the function from that format to a set of Boolean sum-of-products equations prior to carrying out the steps in FIGS. 6–11 (described in detail below). The set of Boolean equations includes both sequential (registered) equations and combinatorial equations. Such format transformation procedures are well known in the art and readily available.

CAD software 524 is used after logic design software 522, and produces a bit-map file that indicates to a device programmer 525 the values to program into EPLD 100. This bit-map file, also known as a hex file, is a list of the programmable connections of the AND-array and OR-array of each function block, of the logic expander or interconnect matrix, and other settings of EPLD 100.

Device programmer 525 physically programs the contents of the bit-map file into EPLD 100. The physical form of the programming or configuring depends on the manufacturing technology of the EPLD 100. For example, if EPLD 100 is an EPROM or EEPROM device, the EPROM or EEPROM cells are programmed by charging or discharging a floating gate or other capacitance element. Other PLD devices are programmed by blowing fuses. One typical device programmer 25 is an HW-120 programmer from Xilinx, Inc. This programmer connects to computer 23 via an RS232 serial port. A software driver, such as a Prolink(TM) driver, also available from Xilinx, Inc., downloads programs and data from computer 23 to device programmer 25. Thus, in this manner, EPLD 100 is reduced from an unprogrammed state to a programmed state that carries out a user-specified logic function.

Major Components—Overview

Figure 6:
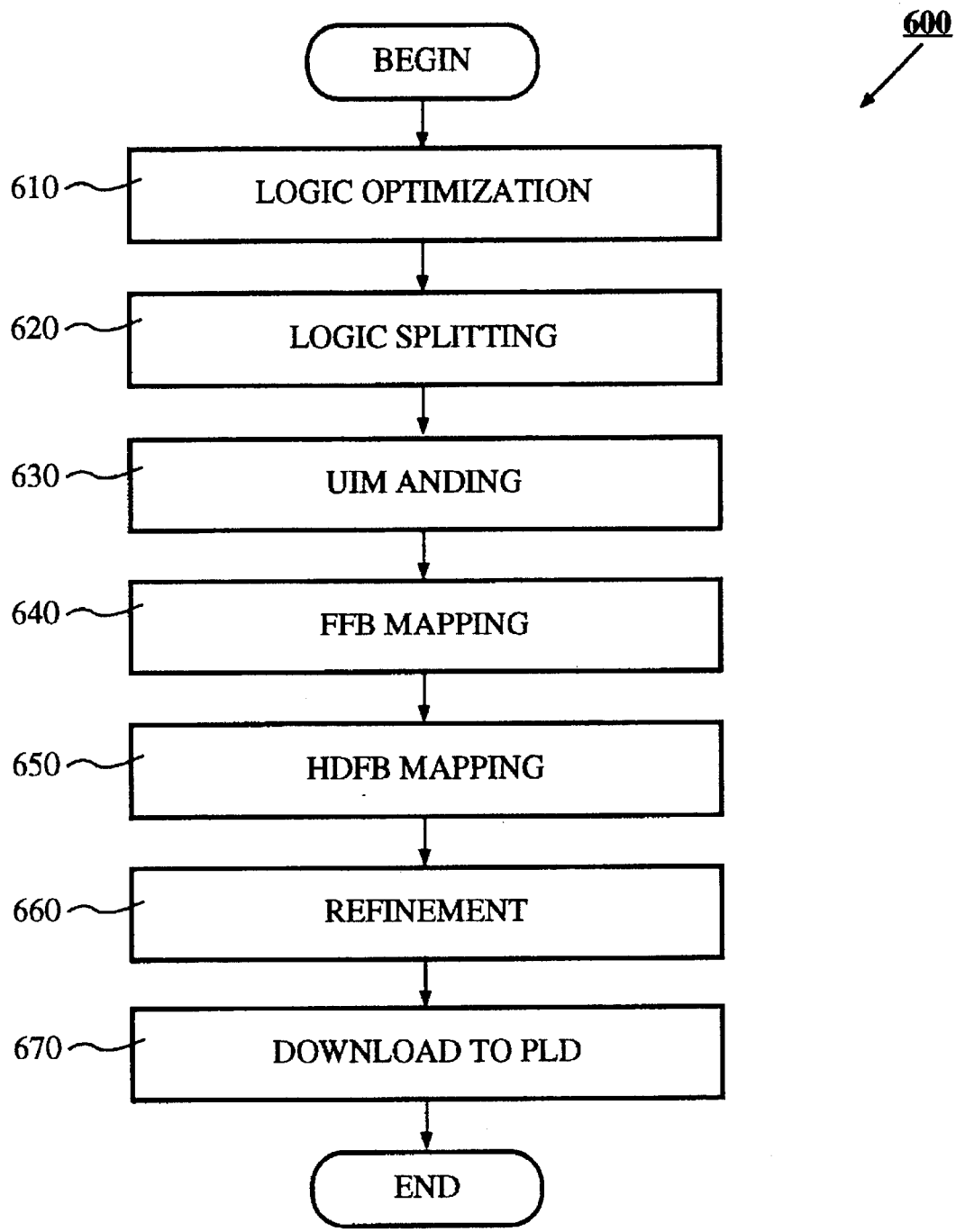
FIG. 6 is a flowchart showing the basic subroutines in an EPLD programming method according to the present invention.

FIG. 6 is a block diagram showing the main subroutines (procedures) embodying the programming method of the present invention. The program 600 sequentially executes a logic optimization subroutine 610, a logic splitting subroutine 620, a UIM ANDing subroutine 630, an FFB Mapping subroutine 640, an HDFB mapping subroutine 650, a refinement subroutine 660, and a bit-mapping (downloading) procedure. Each of these subroutines will be described in greater detail in the following sections.

Figure 7:
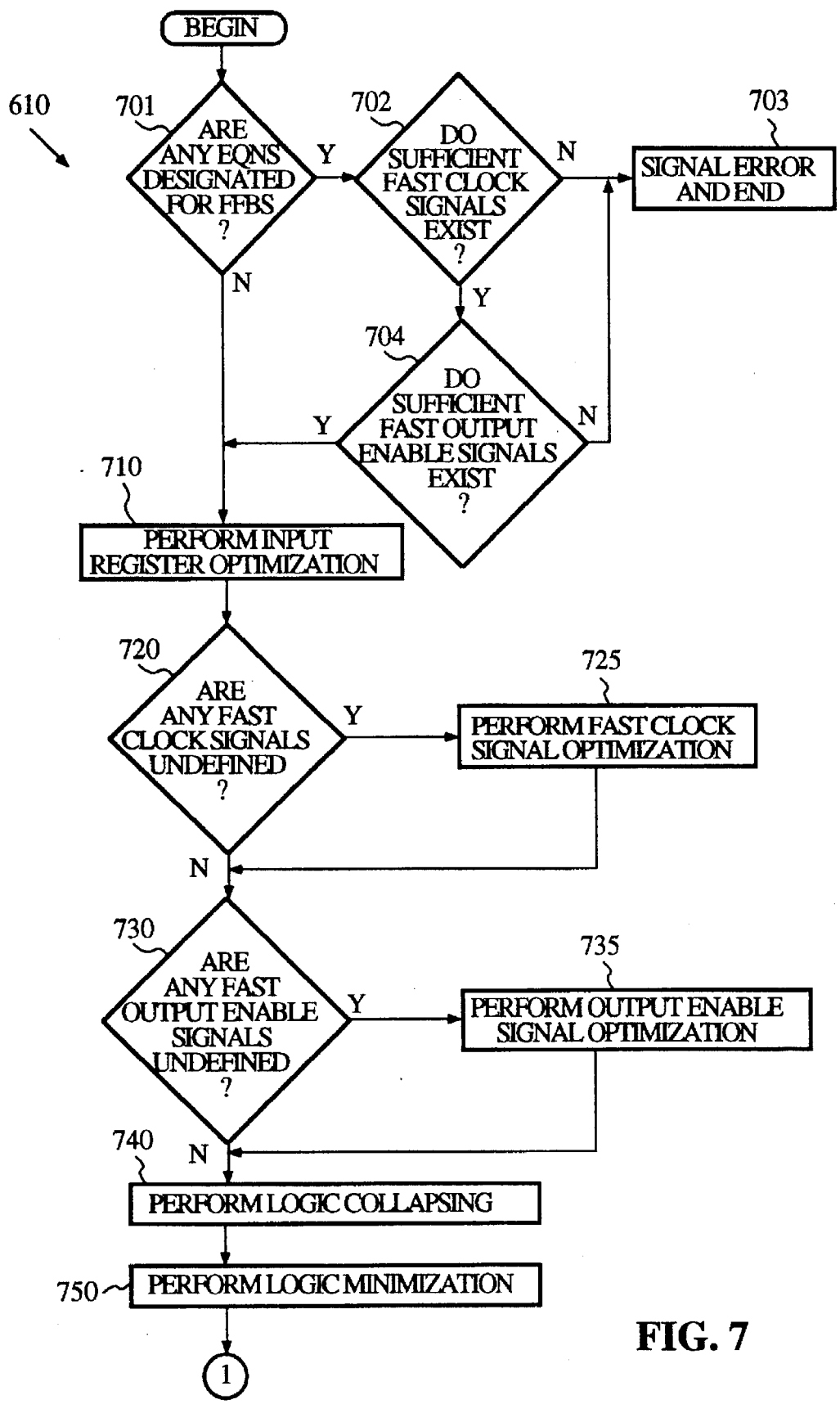
FIG. 7 is a flowchart showing a logic optimization procedure of the EPLD programming method.

Logic Optimization Subroutine (FIG. 7)

The first subroutine called by the program is the Logic Optimization subroutine 610 which reformulates the original Boolean equations of logic function 526 into "optimized" Boolean equations likely to map into the function blocks of EPLD 100.

Logic optimization subroutine 610 determines in step 701 whether any of the equations of the logic function are designated, or "marked" by user 521 during design entry into computer 523 as being "fast" equations (i.e., implementable in the FFBs). If "fast" equations are designated, then the subroutine proceeds to step 702; otherwise, the subroutine proceeds to step 710. In step 702, the subroutine determines whether sufficient Fast Clock resources are actually available to support all of the designated "fast" equations. As described previously, there are only two global Fast Clocks which are used to clock registers 222 of FFBs 220 (FIG. 2(A)).

If the "fast" equations require three or more unique Fast Clock signals, then the logic equation cannot implement the logic function because three different clock signals cannot be transmitted on the two Fast Clock lines. When this occurs, the subroutine branches to step 703 which indicates an error on a computer screen (or other output device) and terminates the program. However, if the "fast" equations require two or less Fast Clock lines, then the program proceeds to step 704.

In step 704, a second test is performed to determine if the "fast" equations require more than two Fast Output Enable resources. Similar to the Fast Clock lines, each EPLD 100 of the XC7300 EPLD family has only two global Fast Output Enable lines controlling output buffer 224 (FIG. 2(A)). If the "fast" equations require three or more unique Fast Output Enable signals, then the logic equation cannot implement the logic function. When this occurs, the subroutine branches to step 703 which indicates an error and terminates the program. However, if the "fast" equations require two or less Fast Output Enable lines, then the program proceeds to step 710.

In step 710, logic optimization subroutine 610 identifies registered equations (as opposed to combinatorial equations) which are implementable by the latches/flip flops of input block 510 (see FIG. 4). By implementing registered inputs in the input blocks, macrocell flip flops resources are preserved for other functions. The process of determining whether a registered equation (R-EQN) is implementable in an input register is determined in accordance with the following pseudocode procedure:

---

Begin procedure;
For each R-EQN in the logic function do:
    If (R-EQN input is a single input signal)
        and (R-EQN input does not drive internal logic),
    then
        if R-EQN clock is a previously-defined Fast Clock,
        then implement R-EQN in an input block,
        else designate R-EQN as FFB-OK;
End procedure.

---

The registered equations designated as "FFB-OK" are then analyzed to determine if they can be efficiently implemented in an input block. This is determined by the most efficient use of Fast Clock lines. In addition to the two Fast Clock lines connected to the flip-flops of the function blocks, the input blocks 510 receive a third Fast Clock line (FastCLK2 in FIG. 4). The subroutine determines the registered equation whose clock signal produces the most efficient use of the third Fast Clock Line. This use is determined by assigning the FFB-OK registered equation a weight value according to the following function:

$$\text{Weight } (R\text{-}EQN) = c_1 \ast a + c_2 \ast b - c_3 \ast c$$

where:

$c_1, c_2, c_3$ are constants, and a=largest possible number of input registers implemented by the logic function multiplied by an optimization constant (one whose value is selected to optimize results);

b=largest possible number of FFBs implemented by the logic function multiplied by an optimization constant; and c=number of FFBs prevented from implemented by the logic function multiplied by an optimization constant.

After weight values are determined for all of the FFB-OK registered equations, then the equation with the largest weight is designated as an input register and that equation's clock signal is defined as the Fast Clock signal. Any other qualified equations using the same clock signal are also implemented in input blocks. This process is then repeated until all qualified registered equations are implemented in input blocks or until all three Fast Clock lines are defined.

Next, in step 720, the logic optimization subroutine 610 determines whether any of the two global Fast Clock lines (those applied only to the function blocks) are unused. That is, if the clock signals for the designated "fast" equations and the input block equations are designated as "don't care" by the user (i.e. not used explicitly), then both Fast Clock lines are free for use in either the HDFBs or the FFBs. Similarly, if only one of the two global Fast Clock lines is used by the "fast" equations, then the second Fast Clock line is available for use in the HDFBs. If neither of the lines are available, then subroutine 610 proceeds to step 730. However, if one or both of the lines are available, then subroutine 610 proceeds to step 725.

In step 725, subroutine 610 determines the most efficient use of the available Fast Clock lines by identifying the most common clock signals associated with the registered equations. This process begins by identifying all registered equations whose clock signals are not previously-defined Fast Clock signals. Subroutine 610 then assigns a weighted value to each clock signal which is determined by the global effect of defining the equation's clock signal as a Fast Clock. That is, the clock signal of one registered equation is tentatively designated as a Fast Clock. The subroutine determines the clock signal that produces the most efficient use of the third Fast Clock Line. This use is determined by assigning the clock signal a weight value according to the following function:

$$\text{Weight } (FCLK) = c1*a + c2*b - c3*c + c4*d$$

where:

$c_1$, $c_2$, $c_3$, $c_y$ are constants

Among the tentatively designated Fast Clock

The subroutine determines the clock signal that produces the most efficient use of an available Fast Clock. This is determined by assigning a weight value to each tentatively marked fast clock according to the following function:

a=number of Pterm clocks eliminated by the tentative assignment;

b=number of FFBs used as a result of the tentative assignment;

c=number of FFBs prevented from implemented by the tentative assignment; and d=penalty for using a macrocell to create a Fast Clock After weight values are determined for all of the clock signals, then the clock signal associated with the equation having the largest weight is designated as a Fast Clock signal. This process is then repeated for the second Fast Clock line, if it is available. The subroutine then proceeds to step 730.

In step 730, logic optimization subroutine 610 determines whether any of the two Fast Output Enable lines are unused by the designated "fast" equations. That is, if the output enable signals for the designated "fast" equations are designated as "don't care" by the user, then both Fast Output Enable lines are free for use in either the HDFBs or the FFBs. Similarly, if only one of the Fast Output Enable lines is used by the "fast" equations, then the second Fast Output Enable line is available for use in the HDFBs. If neither of the Fast Enable lines are available, then the subroutine proceeds to step 740. However, if one or both of the lines are available, then the subroutine proceeds to step 735.

In step 735, subroutine 610 determines the most efficient use Of the available Fast Output Enable lines by identifying the most common enable signals associated with the equations. This process begins by identifying all equations whose enable signals are not previously-defined Fast Output Enable signals. The Logic Optimization subroutine then assigns a weighted value to each equation which is determined by the effect of defining the equation's enable signal as a Fast Output Enable. That is, the enable signal of one equation is tentatively designated as a Fast Output Enable. The subroutine determines the enable signal that produces the most efficient use of the third Fast Output Enable. This use is determined by assigning the enable signal a weight value according to the following function:

$$\text{Weight } (FOE) = c1*a + c2*b - c3*c + c4*d$$

where:

$c_1$, $c_2$, $c_3$, $c_y$ are constants a=number of Pterm clocks eliminated by the tentative assignment;

b=number of FFBs used as a result of the tentative assignment;

c=number of FFBs prevented from implemented by the tentative assignment; and d=penalty for using a macrocell to create a Fast Output Enable After weight values are determined for all of the enable signals, the signals are sorted according to their weight value, and the enable signal associated with the equation having the highest weight is designated as a Fast Output Enable Signal. If both Fast Output Enable lines are available, the process is repeated for the second line. Subroutine 610 then proceeds with step 740.

Step 740 includes logic collapsing, which is a well-known process of combining two or more related equations into larger equations for more efficient implementation in the function blocks. According to one embodiment of the present invention, collapsing is controlled by the Pterm and input signal limits associated with a desired function block type. For example, with respect to the XC7300 EPLD family, FFB macrocells receive 4 Pterms, whereas HDFB macrocells receive up to 17 Pterms. Therefore, collapsing takes into account whether a particular combination forces two FFB-OK equations into a condition in which the combined equation may only be implemented in an HDFB. If so, then the combination is prevented.

Finally, in step 750 logic minimization is performed using a well-known method such as that of the Espresso (a logic minimizer developed at the University of California, Berkeley). The Logic Optimization subroutine then terminates and the program continues with logic splitting subroutine 620 (see FIG. 6).

Figure 8:
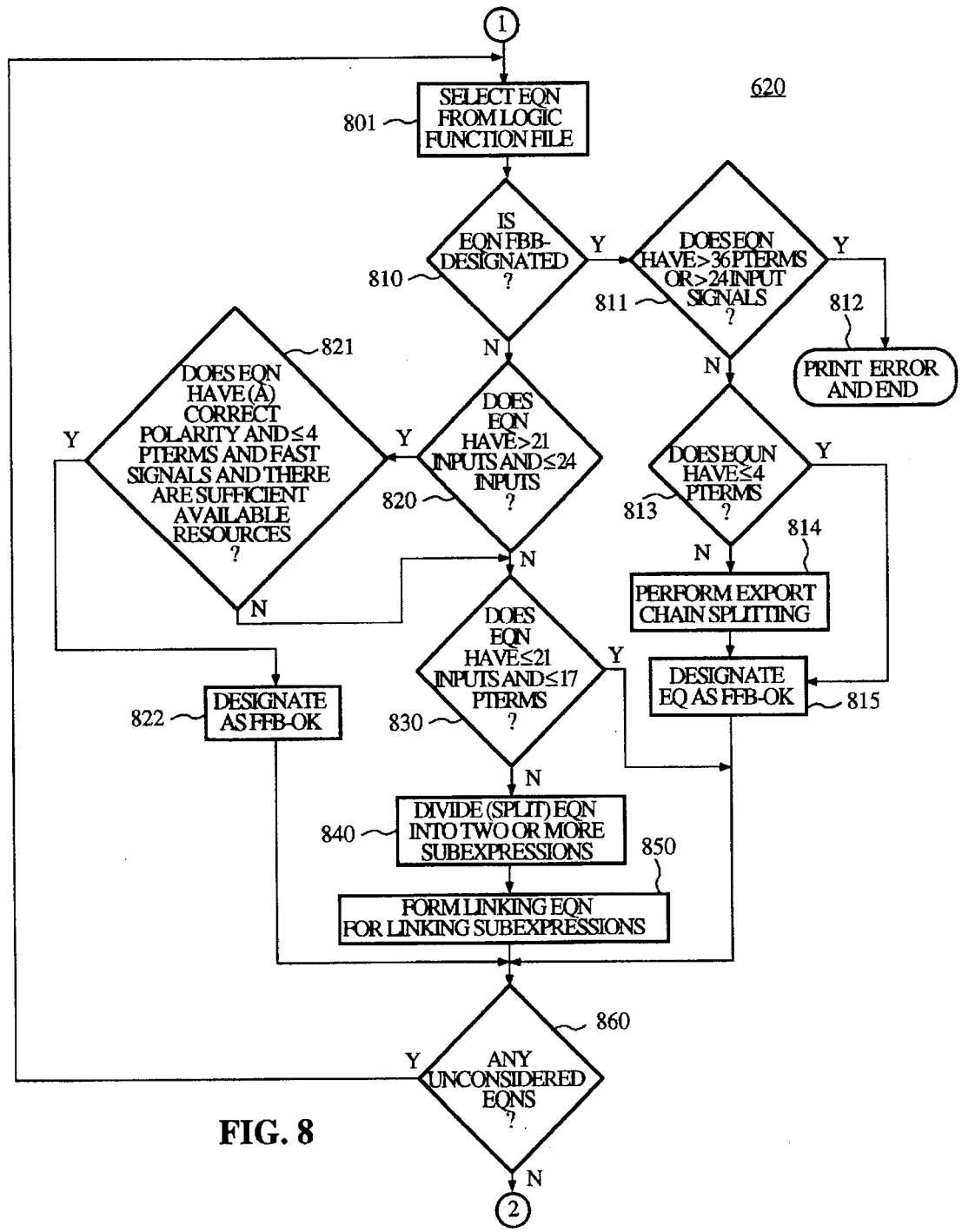
FIG. 8 is a flowchart showing a logic splitting procedure of the EPLD programming method.

Logic Splitting Subroutine (FIG. 8)

Logic splitting subroutine 620 splits large logic portions which cannot be implemented (mapped) directly into an FFB or HDFB into two or more subportions. For example, the HDFB of the XC7300 EPLD family includes 21 input terminals and nine output terminals connected to the UIM. Thus, if a logic portion includes more than 21 input signals or more than nine output signals, then that logic portion must be split into two or more subportions to be implemented by the EPLD. In accordance with the present invention, the splitting subroutine divides logic to fit within each of the multiple types of logic blocks. This division requires consideration of the specific circuitry associated with each type of logic block.

With respect to the XC7300 EPLD family, there are two forms of splitting: FFB (or export chain) splitting using the export chain feature of the FFBs 200 (discussed above), and HDFB splitting using the AND gate feature of the UIM 400. Referring back to FIG. 2(B), FFB splitting involves dividing a Boolean equation having more than four product terms into two or more subequations, each having four or fewer product terms. For example, the Boolean equation:

$$ly = P_1 + \ldots + P_8$$

is split into the two subequations:

$$ly1 = P_1 + \ldots + P_4$$

$$ly2 = P_5 + \ldots + P_8.$$

Referring to FIG. 2(B), /y1 is then assigned to the macrocell 220A, and /y2 is assigned to macrocell 220B. Next, the output signal of OR gate 225A is "exported" via the product term assignment line 226 to the specialized fifth input terminal of OR gate 225B of macrocell 220B.

The HDFB splitting form uses UIM 400 to AND together output signals from the macrocells of FFBs 200 and HDFBs 300. For example, the Boolean equation:

$$y = P_1 + \ldots + P_{30}$$

can be split into two subequations:

$$/y1 = P_1 + \ldots + P_{15}$$

$/y2 = P_{16} + \ldots + P_{30}.$ third equation:

$/y = /y1 * /y2$ is produced which is implemented in one embodiment in UIM 400 using the UIMANDing subroutine discussed below.

FIG. 8 shows a flow diagram illustrating the essential portions of logic splitting subroutine 620 which includes both FFB and HDFB splitting. Upon entering logic splitting subroutine 620, all of the equations of the logic function are stored in a file (not shown for simplicity). In step 801, one of the stored equations is selected from the file. Step 810, determines whether that equation is designated as "fast" (i.e., an FFB-designated equation). If the equation is an FFB-designated equation, subroutine 620 branches to step 811; otherwise, the subroutine continues with step 820.

In step 811, the FFB-designated equation is checked to determine whether the equation fits within the parameters of the FFB. In other words, if the designated equation is determined to be too large for one FFB then in step 812, an error message is provided on an output device indicating a fail error has occurred in the programming process, and the program is terminated. However, if the selected equation meets the criteria for mapping into an FFB, subroutine 620 continues with step 813. In step 813, subroutine 620 determines whether the selected equation contains less than or equal to 4 Pterms. If the equation has less than or equal to 4 Pterms, then splitting is unnecessary and the equation is designated as FFB-OK in step 815. However, if the equation has more than four Pterms, the subroutine continues with step 814, in which FFB splitting is performed using the export chain feature of the FFBs (discussed in detail above). Then, the equation is designated as FFB-OK in step 815, and the subroutine defaults to step 860 (discussed below).

However, if an equation is not FBB-designated in step 810, the number of signals associated with the selected equation are then counted to determine whether there are greater than 21 but less than or equal to 24 input signals in step 820. If this test is met, subroutine 620 transfers to step 821 in which a multi-part test determines if the non-designated equation is implementable in an FFB. Specifically, the test requires that (1) the equation is used in negative polarity and has less than or equal to 4 Pterms; (2) and the equation does not use a Pterm output enable signal, a Pterm clock signal and is not used in negative polarity in a UIM AND function; (3) the total number of FFB-OK equations is less than or equal to the total number of FFB macrocells minus 1, and (4) the number of different inputs used in all FFB equations including the selected equation is less than or equal to the total number of input signals to the FFBs. If all four elements of this test are met, then subroutine 620 transfers to step 822 in which the selected equation is designated as FFB-OK, and the subroutine then defaults to step 860. If the outcome of this test is negative, subroutine 610 passes to step 830.

In step 830, the selected equation is tested to determine if the number of input signals is less than or equal to 21 and the number of Pterms is less than or equal to 17, thereby determining whether the equation fits within one HDFB macrocell. If the outcome of this test is positive, then subroutine 620 branches to step 860. If the outcome of this test is negative, the subroutine continues with step 840.

In step 840, the selected equation is divided into two or more subequations having less than or equal to 21 input signals and less than or equal to 17 Pterms. In one embodiment, subequations are formed which have 8 or fewer Pterms. However, note this number is reduced during Refinement Subroutine 660 (described below). In step 850, a new equation is formed which is a sum of products equation combining the outcomes of all subexpressions divided from the selected equation. This equation is designated as "UIM-OK". Subroutine 620 then defaults to step 860.

In step 860, the subroutine checks to determine if all equations have been processed. If any equations are unprocessed, subroutine 620 returns to step 801; otherwise subroutine 620 ends and control is passed to the UIMANDing subroutine 830.

Figure 9A:
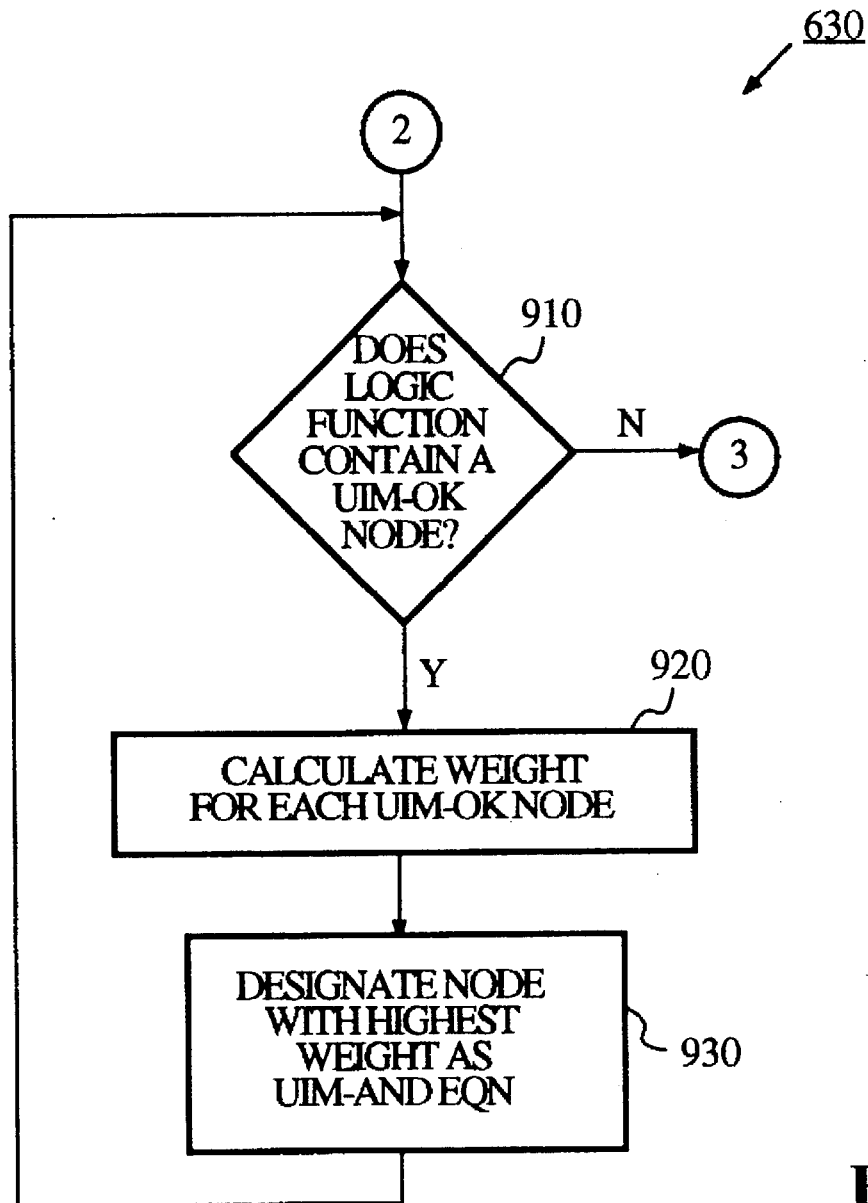
FIGS. 9A and 9B are flowcharts showing a UIM ANDing procedure of the EPLD programming method.
Figure 9B:
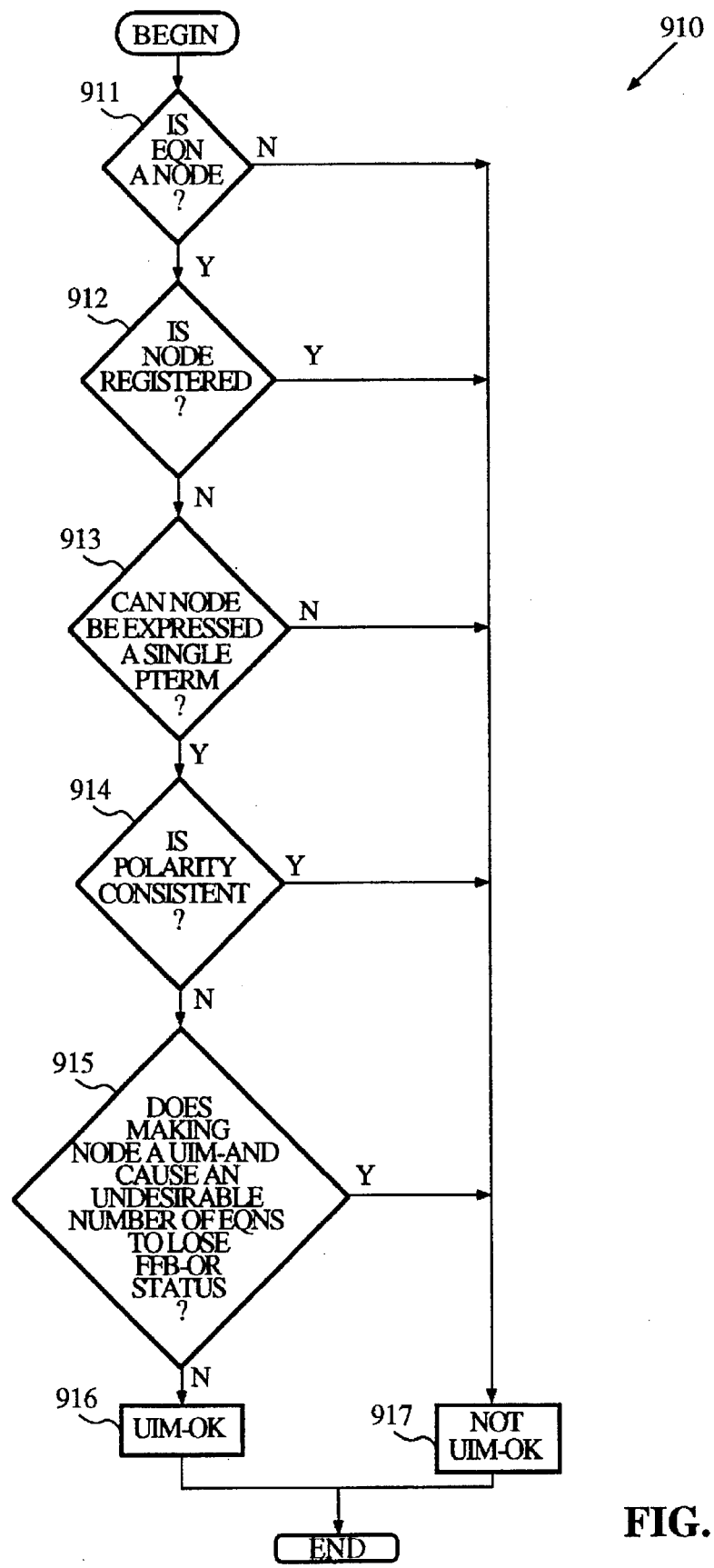

UIM ANDing Subroutine (FIGS. 9A and 9B)

UIM ANDing is used as an alternative to placing an equation in a macrocell. Using the UIM to form AND gates typically results in significant advantages, such as requiring fewer macrocells and fewer passes of logic, thereby creating a faster circuit. However, a dual-block architecture has the disadvantage of limiting the equations which are eligible to be placed in FFBs. For this reason, care must be taken in deciding which equations are formed using the UIM AND.

The UIMAND array can form an AND function using any of the input signals into the UIM. For instance, in one embodiment an internal node of the form $n = a*b*c$ is formed in the UIM. Conversely, if the internal node is equal to $n = a+b+c$, an equation $n = /a*/b*/c$ is created using DeMorgan's theorem, and the inverter is pushed ahead into a subsequent equation to which n is fed.

"Polarity" problems are created when output signals from FFB macrocells are fed back into the UIM. Because these feedback signals are applied on single lines (there is no complementary line) the polarity of these signals is fixed at the output line of the FFB. Therefore, a polarity problem can arise if the signals from the FFB used to form a UIM AND equation are of an incorrect polarity.

In contrast, output signals from the HDFBs are also fed back into the UIM on single lines, but these signals are inverted by the ALU, if necessary. Specifically, the ALU includes a lookup table which generates any logic function of two inputs. Therefore, any designated equation can be inverted by the ALU to provide a desired polarity at the output of the HDFB's macrocell.

FIGS. 9(A) and 9(B) show essential steps associated with UIM ANDing subroutine 630. Referring to FIG. 9(A), UIM ANDing subroutine 630 begins by determining whether any of the equations associated with the logic function qualify as "UIM-OK". The process for determining whether an equation is UIM-OK is illustrated in FIG. 9(B). As shown in FIG. 9B, step 911 determines whether an equation qualifies as a "node". The term node is used to designate an equation whose outputs are not applied to an EPLD I/O pin. In other words, all output signals of a node are received as input signals in a subsequent equation. Further, at least one node of the logic equation must meet the following multi-step test:

Step 912—the node cannot be registered.

Step 913—the node must be expressed as a single Pterm.

Step 914—the node must meet the following polarity requirements:
(a) all node input signals must not be used in another UIM-OK equation in an opposite polarity and (b) all node input signals which are feedback signals from an FFB macrocell must have a positive polarity (since the device does not provide inversion resources for feedback signals from FFBs).

Step 915—the node, if implemented as a UIM-AND function, must not cause an undesirable number of FFB-OK equations to lose their FFB-OK status (i.e., require these nodes to be implemented only in an HDFB). In one embodiment, if the number of FFB-OK equations falls below 18, then the node is not implemented as a UIM-AND function.

If all of steps 911-915 are satisfied, then the node is considered UIM-OK in step 916. Otherwise, the node is designated not UIM-OK in step 917. This process is then performed on all equations of the logic function, and if one or more of the equations are UIM-OK, then a positive response is returned in step 910.

If a UIM-OK node exists in step 910, UIM ANDing subroutine 630 continues with step 920 in which a weight value is calculated for each UIM-OK node. Weights are determined based on the following equation:

$$\text{Weight (Node/EQN)} = c_1 - c_2 - c_3$$

where:
- $c_1$ = number of inputs to node;
- $c_2$ = number of nodes which lose UIM-OK status if the node is implemented as a UIM-AND equation; and
- $c_3$ = number of equations which lose FFB-OK status if the node is implemented as a UIM-AND equation.

After all nodes are provided with weight values in step 920, the node having the highest weight value is designated as a UIM-AND function in step 930. By designating a node as a UIM-AND function, other equations in the logic function may become UIM-OK and others may lose their UIM-OK status. Therefore, after step 930, subroutine 630 loops up to step 910, and this process is continued until no UIM-OK nodes exist in the logic function. When no such nodes exist, subroutine 630 ends.

Figure 10:
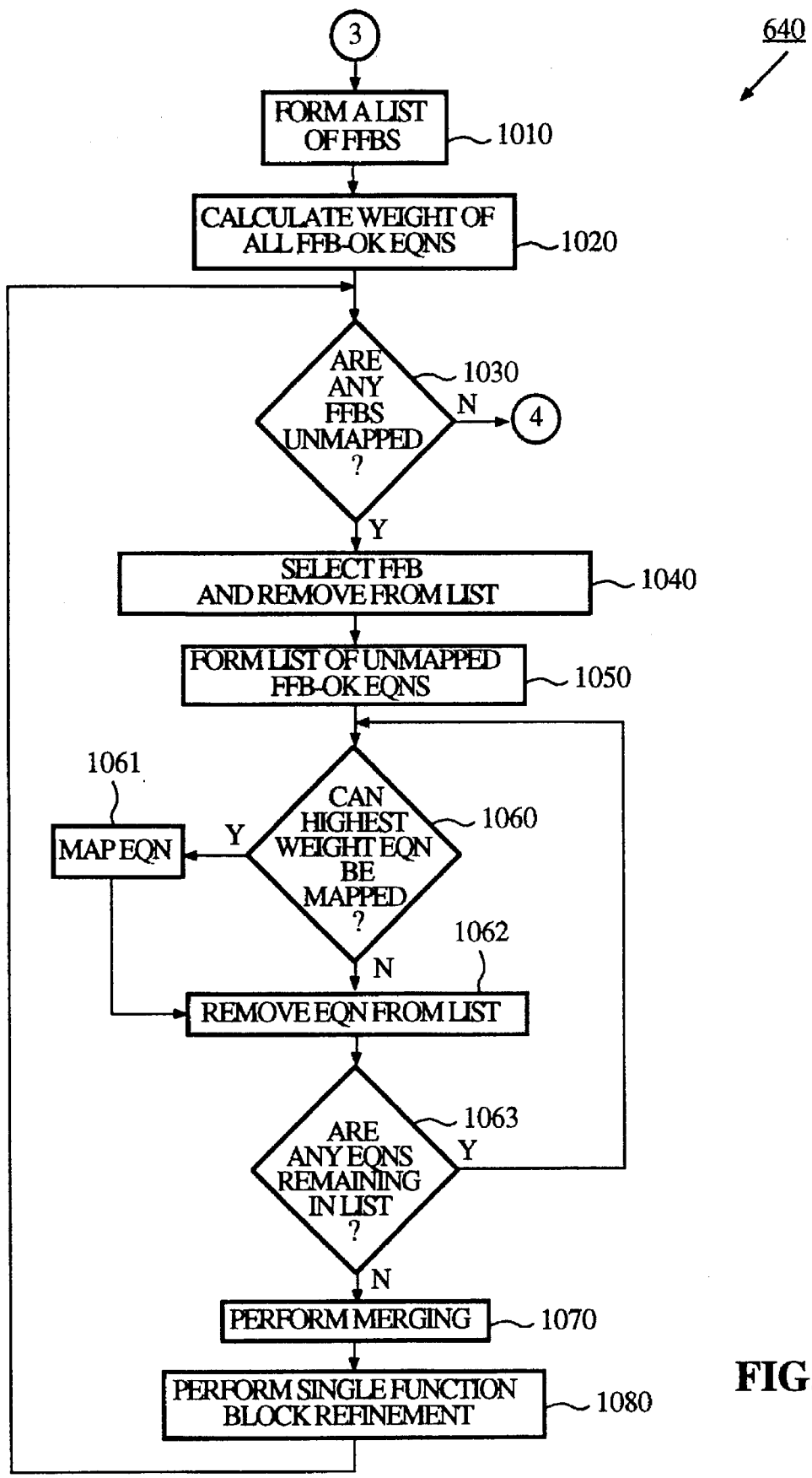
FIG. 10 is a flowchart showing a FFB Mapping procedure of the EPLD programming method.

FFB Mapping Subroutine (FIG. 10)

The purpose of FFB mapping subroutine 640 is to use as many resources of the FFBs as possible before resorting to mapping on the HDFBs. FFB mapping subroutine 640 begins by mapping all of the user-defined "fast" logic portions. After all of the "fast" logic portions have been mapped, FFB mapping subroutine 640 then maps un-designated logic portions into the FFBs. The subroutine may transform un-designated logic portions to fit within an FFB (e.g., inverts the function by changing polarities everywhere else in the logic portion).

FIG. 10 shows a flow chart of FFB mapping subroutine 640. In step 1010, a list is formed of all FFB resources. Next, in step 1020, all of the equations which are designated as FFB-OK are provided a weight value and sorted from highest weight value to lowest weight value. An equation is designated FFB-OK if it meets all of the following tests:

(1) The block doesn't require a Pterm Output Enable signal or a Pterm Clock signal.

(2) The block doesn't explicitly use the HDFB ALU circuit.

(3) The block doesn't use a flip-flop reset signal.

(4) The block doesn't include more than 4 pterm in negative polarity.

The weight value is determined by user-designated FFB equations, which are given the highest weight, and other FFB-OK equations which are weighted by the number of inputs in the equation. In step 1030, subroutine 640 determines if any FFBs have been unmapped. Logically, when subroutine 640 is initiated there are FFBs left unmapped. Therefore, subroutine 640 typically passes to step 1040 in which the FFB having a lowest weight is selected and then removed from the list. Following this, in step 1050 a list is formed of all unmapped FFB-OK equations (of course, the first pass through this step yields a list of all equations weighted in step 1020). In step 1060, subroutine 640 determines whether the equation having the highest weight value can be mapped into the selected FFB. If so, in step 1061 the equation is mapped into the s FFB, and in step 1062 the mapped equation is removed from the list. However, if the highest weighted equation cannot be mapped into the FFB, the equation is removed from the list into step 1062. Step 1063 determines whether any equations are left in a list. If so, subroutine 640 loops up to step 1060 wherein steps 1060-1063 are repeated until a negative outcome is determined in step 1063.

Following step 1063, a merging process is performed in step 1070 wherein single Pterm equations are assigned to macrocells of the FFB in which the export chain is being used (as discussed above).

Finally, in step 1080, a single function block refinement process is performed in which a list of weighted, unplaced FFB-OK equations is formed, and previously mapped equations are temporarily removed from the FFB. If two or more of the unplaced equations can be mapped into the FFB in place of the previously mapped equation, then the previously mapped equation is "unmapped", and the two or more equations are mapped into the FFB.

Following step 1080 the mapping subroutine loops back to step 1030 which determines whether any FFBs are left to be mapped. After all FFBs have been mapped, the outcome of step 1030 is negative and subroutine 640 ends.

Figure 11:
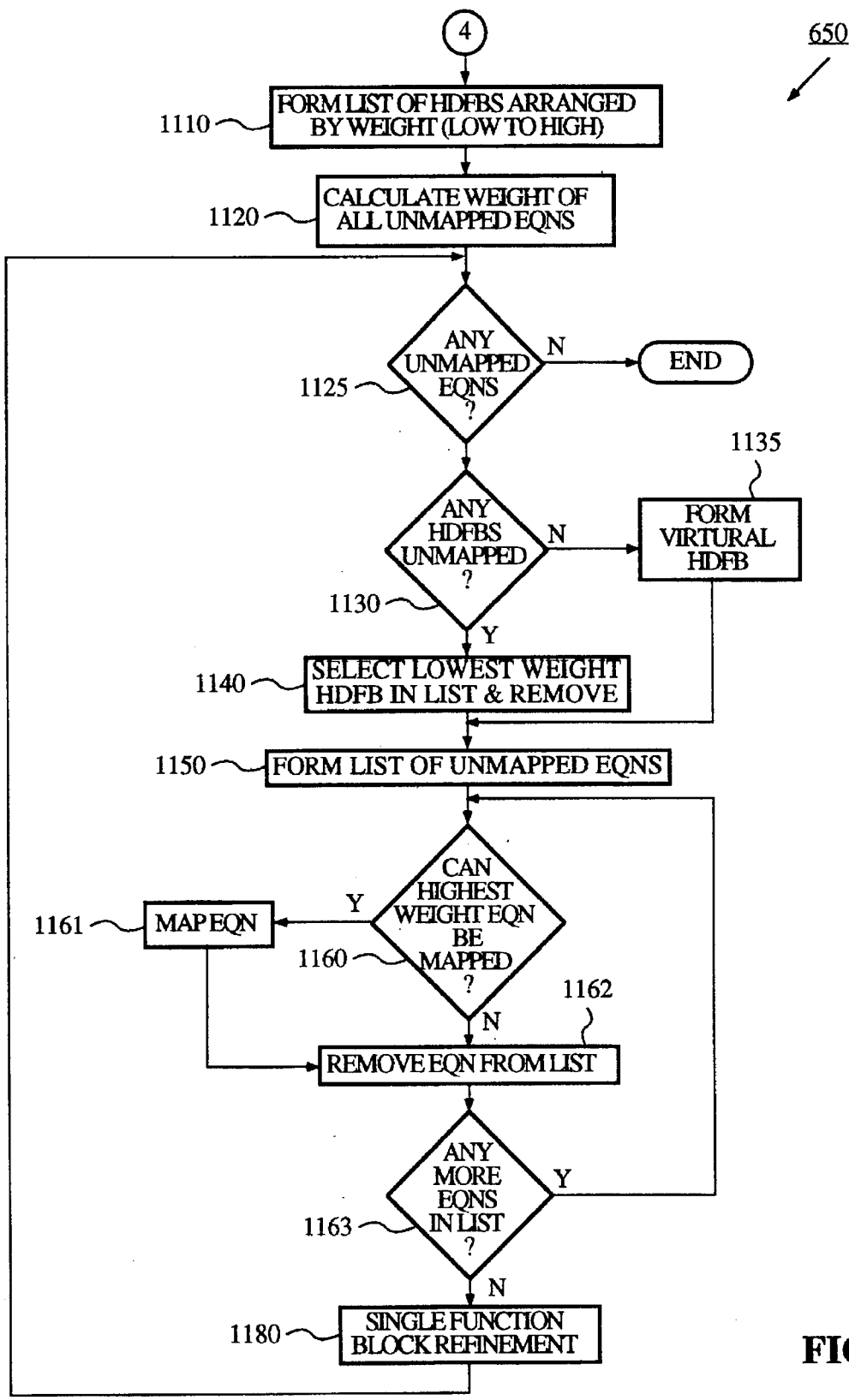
FIG. 11 is a flowchart showing a HDFB Mapping procedure of the EPLD programming method.

FDFB Mapping Subroutine (FIG. 11)

The HDFB Mapping subroutine 650 attempts to fill each HDFB as full as possible. The steps to accomplish HDFB mapping (as shown in FIG. 11) are similar to FFB mapping (as shown in FIG. 10) with four exceptions. Note that similar steps in the two subroutines have identical reference numbers in the last two digits.

First exception: in step 1110, each HDFB is given a weight based on the number of I/O pins 500A connected to the macrocells of the HDFB.

Second exception: in step 1125, the termination decision is determined by whether any equation of the logic function have been left unmapped. Once all equations have been mapped, HDFB mapping subroutine 650 ends.

Third exception: in step 1135, if a negative outcome occurs in step 1030, then all HDFBs of an EPLD have been mapped and there are left over equations. In this case, a "virtual" HDFB is formed in the computer memory which is assigned the same number of macrocells, input signals and output signals as the highest weighted HDFB. This virtual HDFB then becomes the selected HDFB for the mapping procedure, and the subroutine proceeds to step 1150.

Fourth exception: in step 1070 (FIG. 10) FFB mapping is not performed in HDFB mapping subroutine 650 because the HDFB does not include the export chain feature found in the FFBs.

Figure 12A:
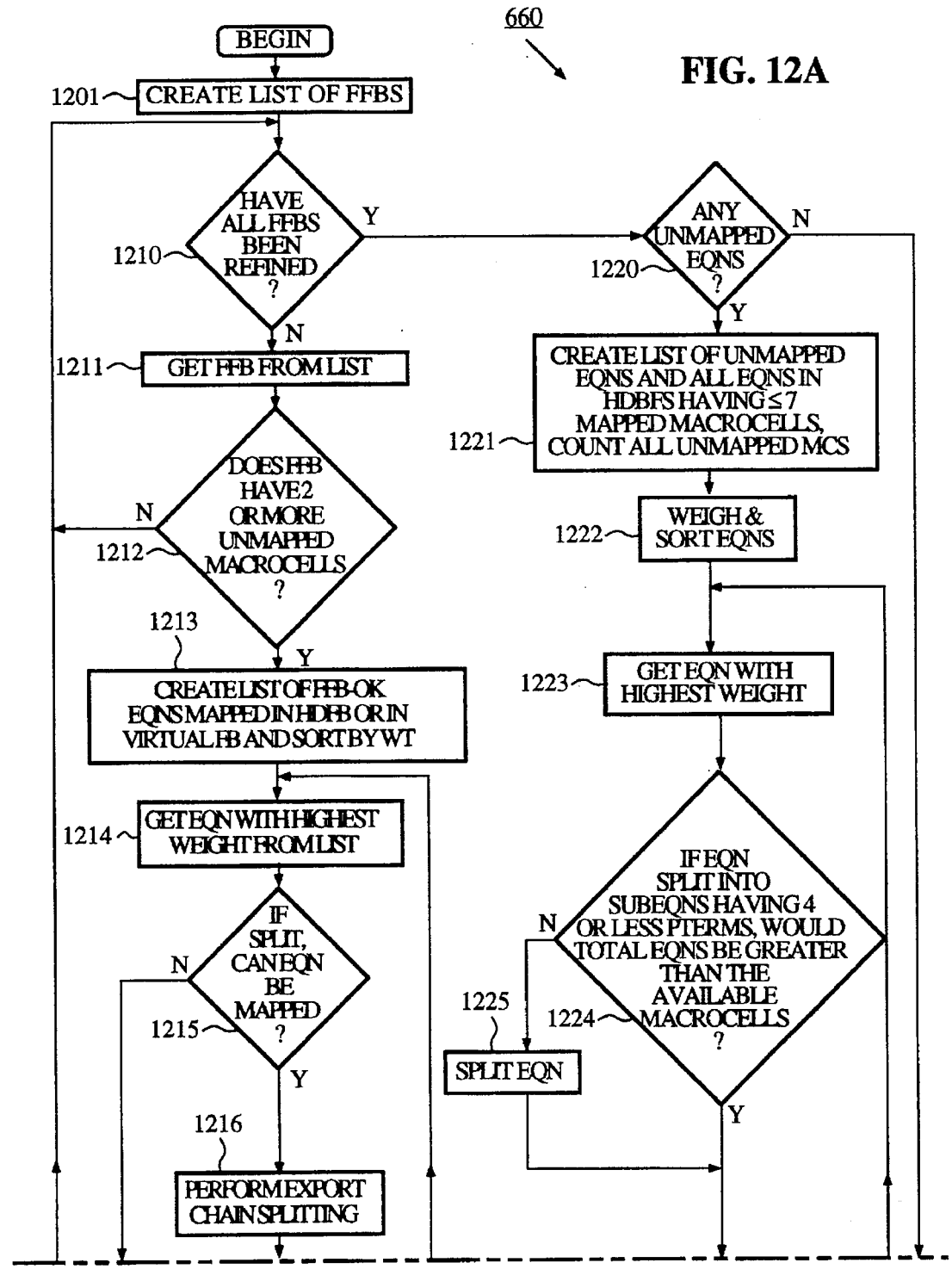

Refinement Subroutine (FIG. 12)

Refinement Subroutine 660 analyzes the results of FFB mapping subroutine 640 and HDFB mapping subroutine 650 and tries to make corrective actions, if necessary. If the FFBs are under-utilized, Refinement Subroutine 660 checks to see if any remaining FFB-OK equations can be mapped into the FFBs. Similarly, if any equations are unmapped, the Refinement Subroutine 660 splits large equations to make more efficient use of the HDFBs.

FIG. 12 shows a flow diagram illustrating the essential steps of Refinement Subroutine 660. In step 1201, a list is created including all FFBs of the target device. In step 1210, the subroutine determines whether all FFBs have been considered for refinement. Of course, when step 1210 is first executed, the result of this decision is always negative.

Assuming a negative result in step 1210, in step 1211 the subroutine selects one FFB from the FFB list (created in step 1201). In step 1212, the subroutine then determines whether the selected FFB contains two or more unused (unmapped) macrocells. If the outcome of step 1212 is negative, then the subroutine returns to step 1210. If the outcome of step 1212 is positive, then the subroutine proceeds with step 1213.

In step 1213, a second list is created containing all FFB-OK equations which are either mapped in an actual HDFB or mapped in a virtual HDFB. In determining whether these equations are FFB-OK, each equation is subjected to tests similar to those described above in the FFB Mapping subroutine. In addition, if the equation contains more than four Pterms (i.e., export chain splitting is required), then the selected FFB is checked to determine if the unmapped macrocells are adjacent (linked by an export chain). If the equation is too large for the unmapped macrocells, or if the unmapped macrocells are not adjacent, then the equation is not designated as FFB-OK. The FFB-OK equations are then sorted using a weight value determined as follows:

$$\text{Weight (EQN)} = c1 + c2 + c3$$

where:
- c1 is inversely proportional to the number of macrocells required to implement the equation;
- c2 is proportional to the number of input signals to the equation; and
- c3 is proportional to the number of Pterms contained in the equation.

Next, in step 1214 the equation having the largest weight value is selected from the list. In step 1215, export chain splitting is performed on the equation and, in step 1216, the equation is tested for mapping into the FFB. If the equation can be mapped using export chain splitting, then mapping is performed in step 1217. Following a negative result in step 1216 or after mapping in step 1217, the subroutine proceeds to step 1218.

In step 1218, the selected FFB is checked to determine if any unmapped macrocells still exist. If not, the subroutine returns to step 1210. If there are unmapped macrocells, then the subroutine proceeds to step 1219 which determines whether there are any equations remaining in the list (created in step 1213). If the list contains additional equations, then the subroutine returns to step 1214 wherein the next-highest weighted equation is selected. If the list is empty, then the subroutine returns to step 1210, which checks whether any FFBs remain in the list created in step 1201.

After all the FFBs are considered for refinement, the Refinement subroutine then proceeds to step 1220. In step 1220, the subroutine determines whether any equations remain unmapped after the FFB refinement. If all of the equations are mapped prior to step 1220, then the program ends. If any equations remain unmapped in step 1220, then the subroutine executes steps 1221 through 1228.

In step 1221, a list is created containing all the unmapped equations. In addition, equations are extracted (unmapped) from HDFBs having seven or fewer mapped macrocells. The purpose of unmapping these HDFBs is to eliminate under-utilized HDFBs to provide resources for mapping all of the equations of the logic function. Further, in step 1221, all unmapped macrocells of all of the HDFBs are counted.

Next, all of the equations in the file are weighed and sorted. As in other subroutines, the weight assigned to each equation is proportional to its number of inputs signals and number of Pterms. The subroutine then proceeds to step 1223 in which the equation having the highest weight value is selected from the list. In step 1224, the subroutine determines whether splitting the equation into sub-equations having 4 or fewer Pterms would cause the total number of equations in the list to exceed the number of unmapped macrocells. If the result of step 1224 is positive, then the subroutine defaults to step 1226; otherwise, the selected equation is split in step 1225. In step 1226, the subroutine then determines whether all equations in the list have been considered and, if not, the subroutine returns to step 1223. If all equations have been considered in step 1224, then the subroutine proceeds to step 1227 in which all of the HDFBs are unmapped. Finally, in step 1228 the subroutine calls the HDFB Mapping subroutine 650 (discussed above), and then quits.

Conclusion

Although the present invention has been described in considerable detail with reference to certain preferred embodiments thereof, other embodiments are possible. For example, the function block types can contain look-up tables instead of AND-OR arrays. In addition, the execution order of some of the described subroutines can be rearranged without changing the results. Therefore, the spirit and scope of the appended claims should not be limited to the description of the preferred embodiments contained herein. The present invention is set forth in the appended claims.

We claim:

1. A method for configuring a programmable logic device to implement a logic function, the method comprising the steps of:
   - identifying portions of said logic function which qualify for implementation in a first type of function block, wherein said first type of function block provides a first speed and density;
   - splitting the qualified portions of said logic function into a plurality of sub-portions such that each sub-portion is implementable in said first type of function block;
   - mapping said qualified portions of said logic function into said first type of function block until said first type of function block is fully utilized; and
   - mapping unmapped qualified portions of said logic function into a second type of function block, wherein said second type of function block provides a second speed and density.

2. The method of claim 1 wherein said step of identifying includes reformulating a plurality of Boolean equations associated with said logic function.

3. The method of claim 2 wherein said reformulating includes designating if any equations of said logic function are user-identified as being implementable in said fast function block.

4. The method of claim 3 wherein if any fast equations are designated, then said reformulating further includes determining if sufficient clock resources are available to support all the designated fast equations.

5. The method of claim 4 wherein if sufficient clock resources are available, then said reformulating further includes determining if sufficient fast output enable signals exist.

6. The method of claim 5 wherein if sufficient fast output enable signals exist or if no fast equations are designated, then said reformulating further includes performing input register optimization.

7. The method of claim 6 wherein after said input register optimization, said reformulating includes determining if any fast clock signals are undefined.

8. The method of claim 7 wherein if any fast clock signals are undefined, then said reformulating further includes performing a fast clock signal optimization.

9. The method of claim 8 wherein if fast clock signal optimization is performed or if no fast clock signals are undefined, then said reformulating further includes determining if any fast output enable signals are undefined.

10. The method of claim 9 wherein if any fast output enable signals are undefined, then said reformulating includes performing an output enable signal optimization.

11. The method of claim 10 wherein if output enable signal optimization is performed or if no fast output enable signals are undefined, then said reformulating includes performing logic collapsing.

12. The method of claim 11 wherein after said logic collapsing, said reformulating includes minimizing logic.

13. The method of claim 1 wherein said splitting includes determining the number of product terms in an equation of said logic function.

14. The method of claim 13 wherein said splitting further includes determining the number of input signals in an equation of said logic function.

15. The method of claim 1 further including the step of determining which equations of said logic function are formed using an AND array in an interconnect matrix.

16. A method for configuring a programmable logic device to implement a logic function, the method comprising the steps of:

identifying portions of said logic function which qualify for implementation in a first type of function block;

splitting the qualified portions of said logic function into a plurality of sub-portions such that each sub-portion is implementable in said first type of function block;

mapping said qualified portions of said logic function into said first type of function block until said first type of function block is fully utilized; and mapping unmapped qualified portions of said logic function into a second type of function block, wherein said first type of function block is a fast function block and said second type of function block is a high density function block.

17. The method of claim 16 wherein said second type of function block includes an Arithmetic Logic Unit (ALU).

18. The method of claim 17 wherein said ALU operates in a first mode and a second mode.

19. The method of claim 18 wherein said first mode includes said ALU programmably generating a Boolean function based on the input signals to said ALU.

20. The method of claim 18 wherein said second mode includes said ALU programmably generating an arithmetic function based on the input signals to said ALU.

21. A method for configuring a programmable logic device to implement a logic function, the method comprising the steps of:

identifying portions of said logic function which qualify for implementation in a first type of function block;

splitting the qualified portions of said logic function into a plurality of sub-portions such that each sub-portion is implementable in said first type of function block, wherein said splitting includes determining the number of product terms and the number of input signals in an equation of said logic function, wherein said splitting further includes determining the polarity of an equation of said logic function associated with a high density block;

mapping said qualified portions of said logic function into said first type of function block until said first type of function block is fully utilized; and mapping unmapped qualified portions of said logic function into a second type of function block.

22. The method of claim 21 wherein said splitting further includes forming a linking equation for linking a plurality of sub-portions.

* * * * *